(12) United States Patent
Kimoto (10) Patent No.: US 7,808,261 B2
(45) Date of Patent: Oct. 5, 2010

(54) CONTACT WITH PLURAL BEAMS

(76) Inventor: Gunsei Kimoto, 1-3-2-807, Daiba, Minato-ku, Tokyo (JP)

( * ) Notice: Subject to any disclaimer, the term of this patent is extended or adjusted under 35 U.S.C. 154(b) by 0 days.

(21) Appl. No.: 12/184,617

(22) Filed: Aug. 1, 2008

(65) Prior Publication Data

US 2009/0045831 A1 Feb. 19, 2009

(30) Foreign Application Priority Data

Aug. 3, 2007 (JP) ............................ 2007-223232

(51) Int. Cl.
*G01R 31/02* (2006.01)
(52) U.S. Cl. ..................................... 324/762
(58) Field of Classification Search ............... 324/72.5, 324/754–762
See application file for complete search history.

(56) References Cited

U.S. PATENT DOCUMENTS

| | | | | |
|---|---|---|---|---|
| 4,618,821 A * | 10/1986 | Lenz | ........................ | 324/754 |
| 5,599,194 A * | 2/1997 | Ozawa et al. | .................. | 439/72 |
| 5,764,072 A * | 6/1998 | Kister | ........................ | 324/754 |
| 6,294,922 B1 * | 9/2001 | Okubo et al. | ................ | 324/761 |
| 6,443,784 B1 * | 9/2002 | Kimoto | ...................... | 439/862 |
| 6,504,388 B2 * | 1/2003 | Comulada et al. | ............ | 324/754 |
| 7,063,541 B2 * | 6/2006 | Grube et al. | .................. | 439/66 |
| 7,202,686 B2 * | 4/2007 | Sakiyama | ................... | 324/761 |
| 7,254,889 B1 * | 8/2007 | Cherian | ........................ | 29/874 |
| 7,256,598 B2 * | 8/2007 | Leong | ......................... | 324/761 |
| 7,423,441 B2 * | 9/2008 | Kimoto | ...................... | 324/762 |
| 7,432,727 B2 * | 10/2008 | Kimoto | ...................... | 324/754 |
| 7,474,110 B2 * | 1/2009 | Mochizuki et al. | .......... | 324/754 |
| 7,498,827 B2 * | 3/2009 | Mochizuki et al. | .......... | 324/754 |
| 7,501,838 B2 * | 3/2009 | Kimoto | ...................... | 324/754 |
| 7,501,840 B2 * | 3/2009 | Kimoto | ...................... | 324/754 |
| 7,511,519 B2 * | 3/2009 | Kimoto | ...................... | 324/754 |
| 7,573,281 B2 * | 8/2009 | Kimoto | ...................... | 324/762 |
| 7,622,937 B2 * | 11/2009 | Kimoto | ...................... | 324/754 |
| 2004/0051541 A1 * | 3/2004 | Zhou et al. | .................. | 324/754 |

FOREIGN PATENT DOCUMENTS

JP   2000-338133   12/2000

* cited by examiner

*Primary Examiner*—Ha Tran T Nguyen
*Assistant Examiner*—Joshua Benitez
(74) *Attorney, Agent, or Firm*—Haynes and Boone, LLP (57) ABSTRACT

To precisely control behavior of a probe at a portion near a contact, and to provide a probe with small electric capacity which can be used to inspect chips having high-speed and high-capacity signals. A parallel spring probe based on a principle of a link mechanism, the link mechanism including: a vertically extending vertical probe; and a plurality of linear or curved horizontal beams extending in a direction perpendicular to the vertical direction, the beams being fastened to a fixed end at one ends and connected to the vertical probe at the other ends, characterized in that distance between at least a pair of adjacent horizontal beams varies along a direction perpendicular to the vertical direction.

5 Claims, 10 Drawing Sheets

CONTACT WITH PLURAL BEAMS

CROSS REFERENCE

This application claims priority to Japanese patent application number 2007-223232, filed Aug. 3, 2007, the disclosure of which is incorporated herein by reference.

BACKGROUND OF THE INVENTION

1. Field of the Invention

The present invention relates to a contact (a probe) of a prober unit for testing circuits of semiconductor chips on a semiconductor wafer in the manufacturing process of electronic devices including LSI. More particularly, the present invention relates to a probe structure of a prober apparatus for use in a probing test. In the probing test, circuit terminals (pads) arranged on the semiconductor chips on a wafer are made to contact with vertical probes for collective measurement of electrical conductivity of the semiconductor chips.

2. Description of the Prior Art

As the semiconductor technology advances, electronic devices have become more highly integrated and a circuit wiring area has increased in each wafer chip. Pads on each wafer chip have also increased in number, and have become more precisely arranged, whereby pad areas become smaller and pad pitches becomes narrower. The pad pitch will become as narrow as 20 μm in the near future.

Chip size packaging (CSP) becomes dominant in which a bear, non-packaged chip is mounted on a circuit board or other substrate. In fabricating the CSP, characteristics and quality of the chips should be verified at the wafer level.

In an exemplary inspection process, a contact assembly is disposed between test equipment and pads on semiconductor chips. The contact assembly includes needle probes arranged in areas each having a portion elastically deformable due to external force. A printed circuit board called probe card is used for electrically connecting the contact assembly and test circuits on the semiconductor chips.

Problems involved in precise and narrow-pitched pad arrangements include the need to provide a compact and dense probe, which abuts a pad on a semiconductor chip for electrical conduction, to correspond to the precise pad arrangements. Problems involved in decreased pad areas include the need of precisely (e.g., to several micrometers) controlling the behavior including scrub operation described later. As semiconductor chips become more sophisticated, there is also a demand for a probe to be applicable to inspections of high speed signals.

A pad on an IC chip to be inspected is typically formed from an aluminum alloy film or gold plating. The surface of the pad is covered with, for example, an oxide film. When the probe tip is made to contact the pad, the tip of the probe pin is vertically pressed (i.e., overdriven) for a certain amount after it touches the pad. The tip rubs (scrubs) a pad surface in a horizontal direction to destroy the oxide film or the like and provide secure conduction between the probe and the pad.

Figure 7A:
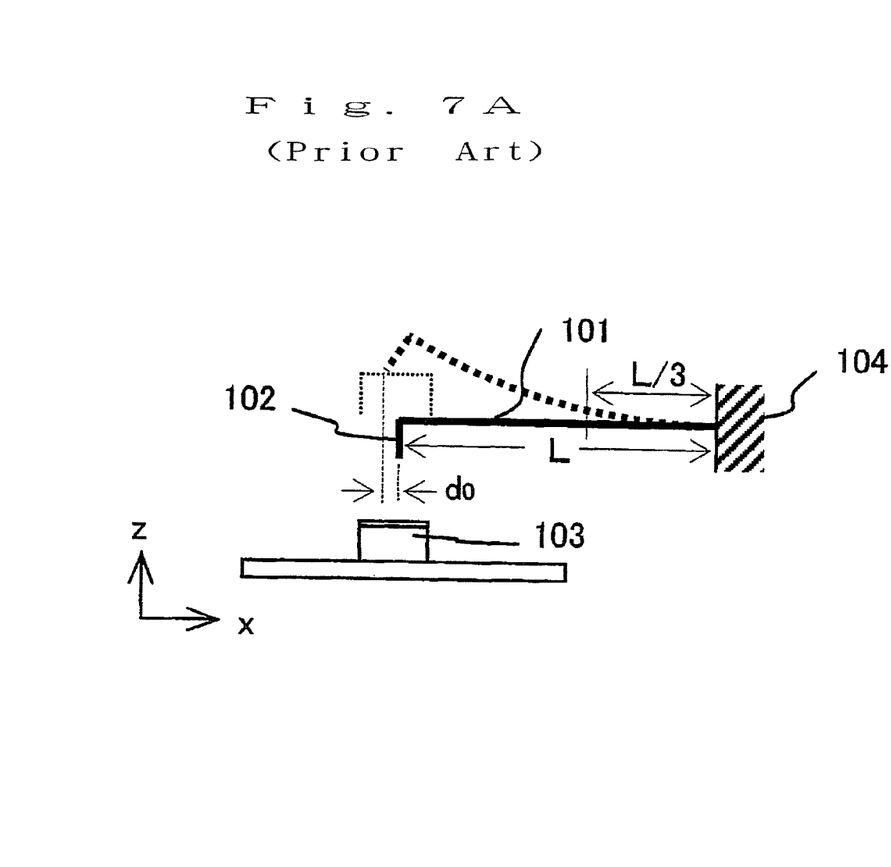
FIG. 7A illustrates a basic structure of a conventional cantilever probe.

FIG. 7A illustrates a conventional cantilever probe structure. The tip of the probe is kept in a vertical position until it touches the pad on a semiconductor chip. As shown in FIG. 7A, a tip of a vertical probe 102 attached to one end of a cantilever 101 having a length L vertically faces with an upper surface of a pad 103 on a semiconductor chip. The other end of the cantilever 101 is fastened to a fixed portion 104 and the cantilever 101 is kept in a horizontal state. The tip of the vertical probe 102 and the upper surface of the pad 103 are brought into contact for inspection when the pad 103 is moved upward or when the fixed portion 104 is moved downward. The cantilever 101 having the length L rotates about a position of one third of the length L (⅓L) from the fixed portion 104 as a center of rotation. Thus, the tip of the vertical probe 102 is moved largely by the distance do while contacting the upper surface of the pad 103. As a result, especially in a fine pad a small cantilever with small L, the distance of the vertical probe tip to travel with respect to the pad area becomes significantly large, and sometimes the probe tip comes off of the pad 103. Thus, measurement cannot be continued. Pressing force at the vertical probe tip becomes large and the upper surface of the pad 103 is sometimes chipped or damaged. As a result, yield of post processes such as wire bonding may decrease.

In a conventional cantilever probe structure, there exists a tradeoff between an overdrive amount and an amount of horizontal displacement of the tip or a scrubbing amount. That is, a relatively large amount of overdrive is required for absorbing varying vertical dimension of the probe to ensure proper pressing force which causes no damage to the pad and proper pressing force larger than a certain amount at a time on multiple pads. To provide a large amount of overdrive, length L of the beam must be large, which in turn produces a large-sized device.

On the other hand, if the length L of the beam is made small to produce a compact device, the distance of the vertical probe tip to travel with respect to the pad area becomes significantly large, and sometimes the probe tip comes off of the pad 103. Thus, measurement cannot be continued. Pressing force at the vertical probe tip becomes large and the upper surface of the pad is sometimes chipped or damaged.

To meet the above-described requirements for the probe structure, i.e., precise and narrow-pitched pad arrangements, and for precise control of the behavior of the probe near the contact including overdrive and scrubbing function, the present inventors have made the following proposals.

Conventional examples proposed by the present inventors will be described with reference to FIG. 7B.

Figure 7B:
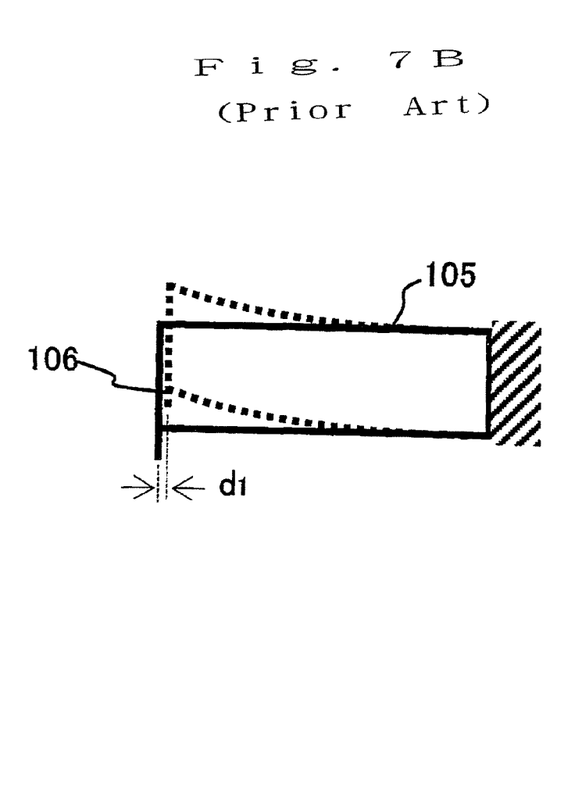
FIG. 7B illustrates a basic structure of a conventional parallel spring probe.

In order to overcome drawbacks of a conventional cantilever probe structure, a structure of a cantilever 101 is formed as a link structure of a parallel spring 105, and a vertical probe 106 is provided at an end of the parallel spring 105 as shown in FIG. 7B. In this link structure, even if the same vertical contact load as FIG. 7A is acted on the vertical probe 106, since it has a link structure, an amount of displacement d1 of a tip of the vertical probe 106 is set to d1<d0. Thus, the amount of displacement can be significantly small.

A parallel spring herein indicates a plurality of substantially identically shaped beams disposed in parallel with one another. Both ends of the beams are fixed on shared non-deforming supports. One of the supports is moved to cause the beams to move in parallel with one another within a certain range while the other of the supports is fixed.

Figure 8:
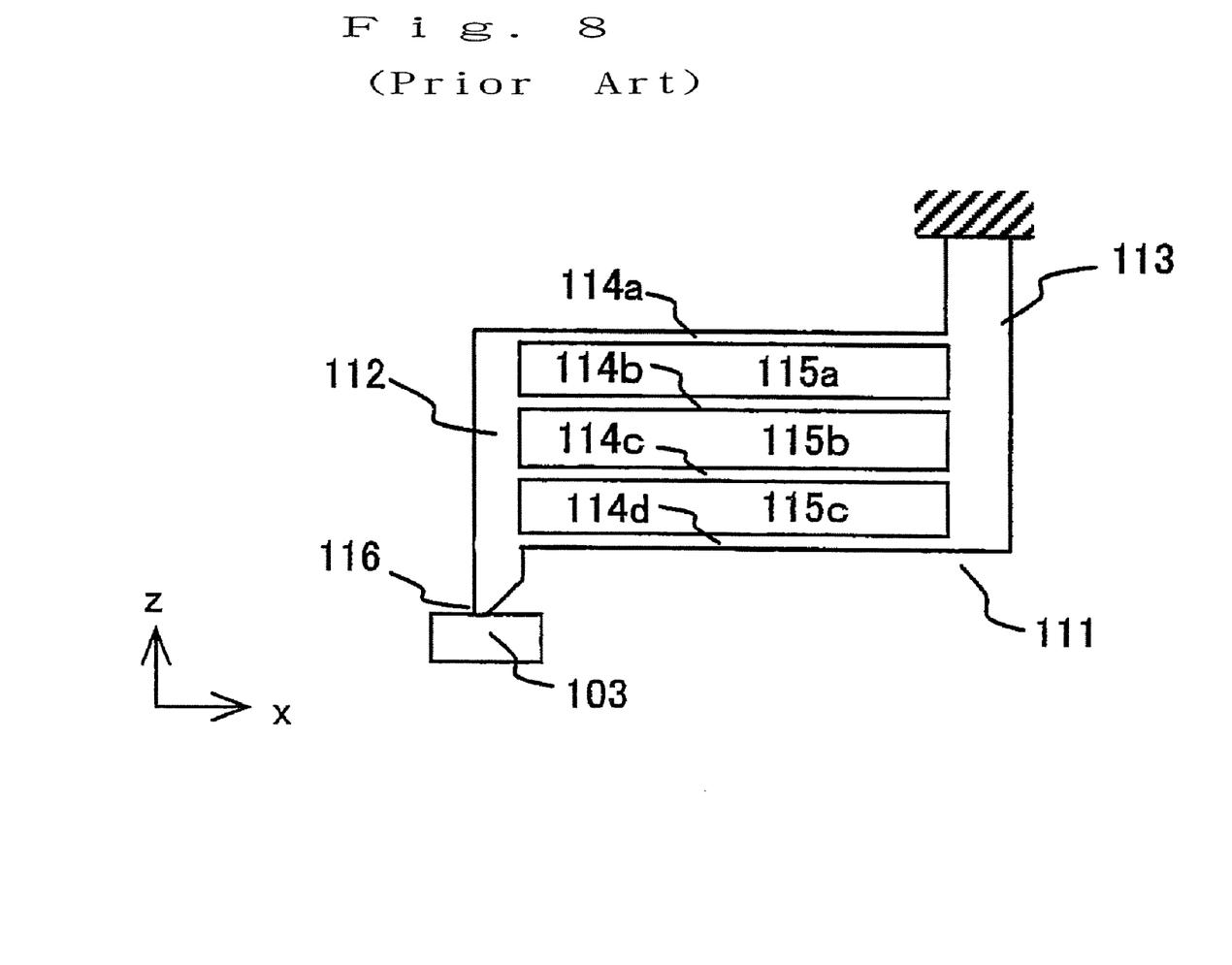
FIG. 8 is a side view of an example of a conventional parallel spring probe structure.

FIG. 8 illustrates a conventional example with a parallel spring structure. An example is disclosed in the following document.

Patent Document 1: Japanese Patent Application Laid-Open No. 2000-338133

FIG. 8 illustrates a probe 111, a vertical probe portion 112, a fixed portion 113, horizontal beams 114a to 114d, slits 115a to 115c, and a probe tip 116.

The probe 111 is made from a thin elastic metal plate, and consists of the vertical probe portion 112, the fixed portion 113 and four horizontal beams 114a to 114d. The vertical probe portion 112 faces with the pad 103. The probe tip 116 is sharply tapered. The fixed portion 113 is supported by an external support means (not shown). The horizontal beams 114a to 114d have almost identical cross sections. The slits 115a to 115c are provided to define the horizontal beams 114a to 114d separately from a thin plate.

Such a configuration can be obtained by decreased distance from a neutral plane at which the maximum bending stress is generated, i.e., by narrow widths of the beams in order to provide proper spring constant under limited stress. The above configuration is provided to address problems that, when a proper spring constant is to be obtained by one or a few connecting beams, the beams must become longer, which may cause the device size growing.

Figure 9A:
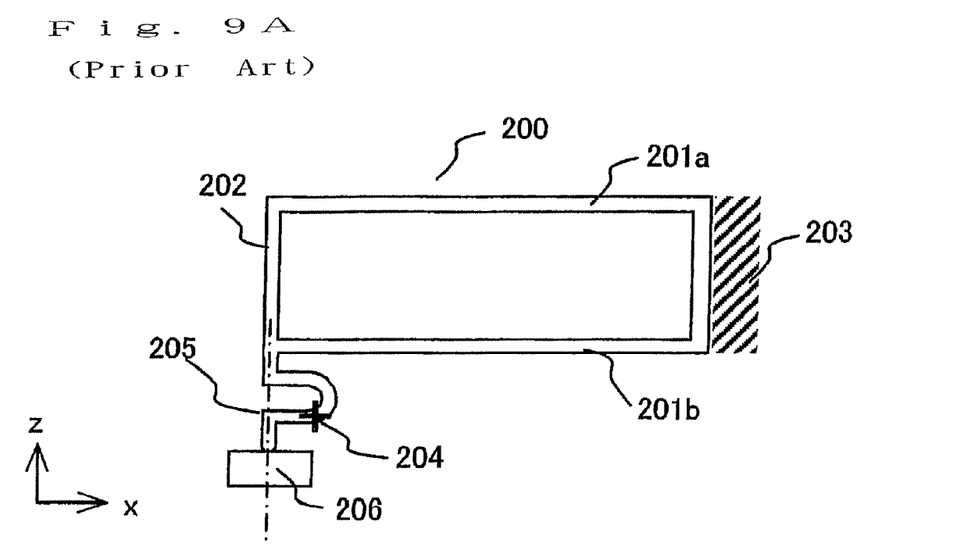
FIGS. 9A and 9B are side views of an example of a conventional parallel spring probe structure with a rotary tip.
Figure 9B:
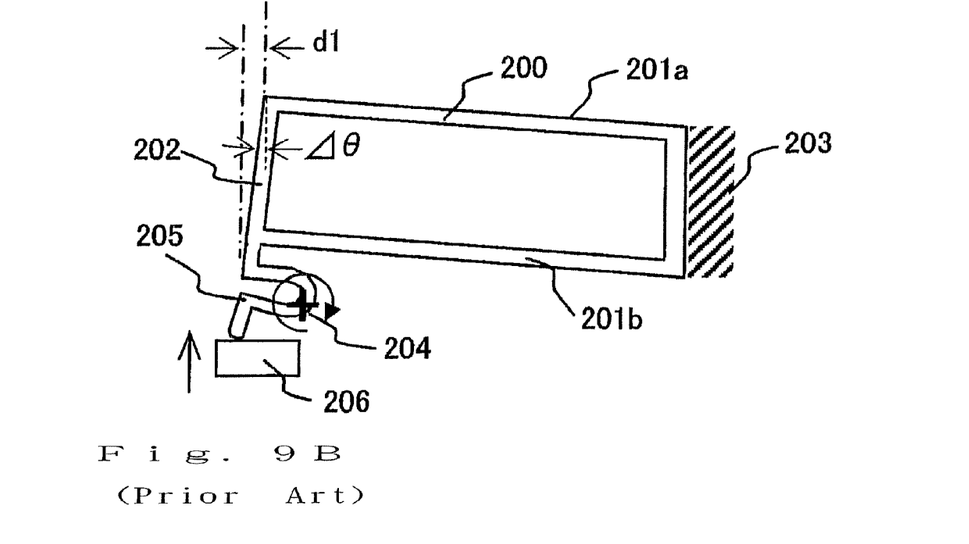

In addition to the parallel spring structure, the inventors have also proposed a probe which includes a rotationally deformed section connected in series to the parallel spring structure and spring-deformable in the rotational direction in order to ensure scrubbing function. This will be described with reference to FIG. 9.

In FIG. 9A, a probe is formed as a link structure with a parallel spring 200. One end 203 of the parallel spring 200 is a fixed end. A rotationally deformed section 205 having a center of rotation 204 is connected in series to a vertical probe portion 202 of the parallel spring 200. When one end of the rotationally deformed section 205 is brought into contact with a surface of a pad 206, electrical conduction is established between the probe and the pad.

In FIG. 9A, parallel beams 201a and 201b of the probe are kept substantially horizontal until the pad 206 moves vertically and touches the tip of the vertical probe 202. Then, as shown in FIG. 9B, after the pad 206 is brought into contact with the tip of the vertical probe 202 and overdrive is provided to vertically lift the tip in a certain amount, the two parallel beams 201a and 201b of the probe rotate substantially in parallel, followed by vertical movement of the vertical probe 202. At this time, as the vertical probe 202 moves vertically, it inclines slightly by $\Delta\theta$ due to rotation as shown in FIG. 9B. The tip of the vertical probe 202 moves by distance d1 horizontally.

The rotationally deformed section 205 follows the movement of the vertical probe 202 to move vertically and horizontally. At the same time, the rotationally deformed section 205 begins rotation clockwise about the center of rotation 204 as the overdrive is continuously provided. Operation of the rotationally deformed section at this time will be described in detail with reference to FIG. 10.

Figure 10:
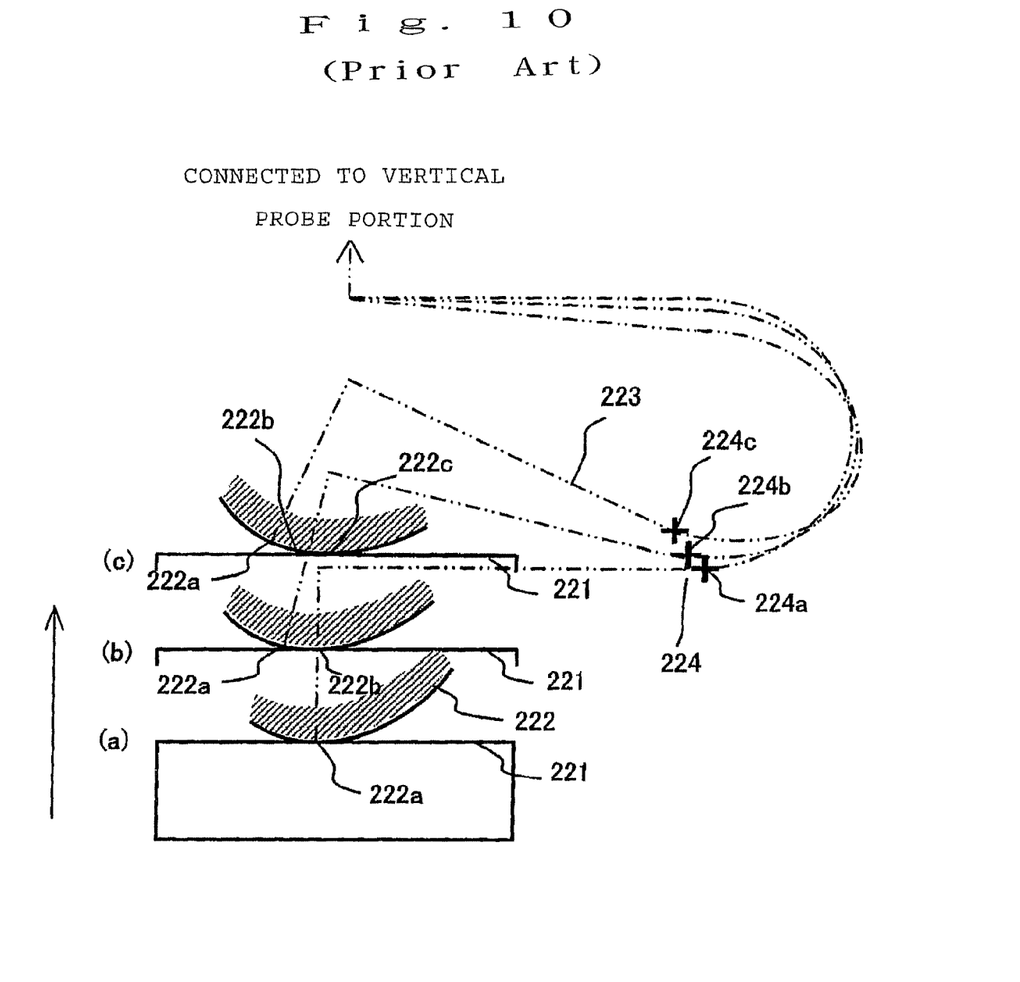
FIG. 10 illustrates basic operation of a rotary tip of the conventional parallel spring probe structure with a rotary tip.

FIG. 10 illustrates the loci of center line of the rotationally deformed section near the pad contact portion at three stages as the overdrive is continuously provided. Here, operation of the parallel spring portion is not illustrated and is considered as fixed.

In FIG. 10, reference numeral 222 denotes apart of the probe tip near the contact portion with the pad surface 221, and 223 denotes the center line of the rotationally deformed section. FIG. 10(a) illustrates the state in which the probe tip is just brought into contact with the pad 221. The probe tip 222 is in contact with the pad 221 at a position 222a. After the overdrive is continuously provided advances and the pad 221 pushes the probe 222 up to the state of FIG. 10(b), rotation is added to the tip portion of the rotationally deformed section about the center of rotation 224. Thus, the contact point of the probe tip and the pad is shifted from 222a to 222b. After the overdrive is further provided and the pad 221 pushes the probe 222 up to the state of FIG. 10(c), further rotation is given to the rotationally deformed section and the contact point of the probe tip and the pad is shifted from 222b to 222c. At this time, the center of rotation is shifted from 224a to 224b, and to 224c as the overdrive is further provided.

Although not shown in the drawing, the tip of the parallel spring portion also displaced in addition to the above-described shifts.

In this series of operation, relative displacement occurs between the pad surface 221 and the probe tip 222 due to rubbing (scrubbing) operation. When the probe tip and the pad are brought into contact, an oxide film is removed as the contact point is shifted from 222a to 222b, for example. An advantageous effect is provided that, in the second half of the contact, electrical conduction is established during the shift from 222b to 222c.

As described above, with the probe structure having multiple parallel springs instead of a conventional cantilever structure, a relatively large amount of overdrive is provided even in a small area. Further, the horizontal behavior near the contact portion of the pad and the probe can be precisely controlled. By connecting the rotationally deformed section to the end portion of the parallel spring structure, a structure to precisely control the scrubbing amount is obtained.

However, if the rotationally deformed section is provided at the vertical probe tip of the parallel spring structure in FIG. 9, and when the probe is to be made compact, the horizontal behavior and rotation of the rotationally deformed section also depend on the horizontal displacement of the vertical probe tip. Thus, a problem may be created that precise control of the behavior in the horizontal direction near the contact portion of the pad and the probe is prevented.

In addition, there arises a problem that, with the plural horizontal beams arranged closely, electric capacity becomes large and thus chips with high-speed and high-capacity signals cannot be inspected.

The invention has been devised to solve the above-identified problems. An object of the invention is to provide a probe in which behavior of the probe near a contact including overdrive and scrubbing function can be precisely controlled even in a compact parallel spring probe, by separating a function of a parallel spring structural part which mainly moves vertically from a function of a rotationally deformed section which mainly moves horizontally.

Another object of the invention is to provide a probe with small electric capacity which can be used for inspection of chips having high-speed and high-capacity signals.

SUMMARY OF THE INVENTION

An aspect of the invention is a parallel spring probe structure, in which distance between at least a pair of adjacent horizontal beams of a plurality of horizontal beams varies along a horizontal direction. The distance between the horizontal beams may vary continuously or discontinuously in the horizontal direction. With this configuration, an advantageous effect is obtained in that behavior of the probe tip can be more precisely controlled, and that an overdrive amount and a scrubbing amount can be properly provided even in pads with small areas.

A further aspect of the invention is characterized in that, in the parallel spring probe structure, the distance between the horizontal beams varies continuously or discontinuously along the direction perpendicular to the vertical direction such that the distance is largest near the fixed end and is smallest near the vertical probe. With this configuration, an advantageous effect is obtained in that movement of the probe tip in the X-direction of the XYZ three-dimensional orthogonal coordinate system can be made to about 0.

A further aspect of the invention is characterized in that, in the parallel spring probe structure, a rotationally deformed section is provided in series to a tip of the vertical probe, the rotationally deformed section includes a curved surface which rotates about one or more of rotational centers when overdrive is provided, relative displacement is caused between the tip of the rotationally deformed section and a pad surface when the tip and the pad surface are brought into contact at a point or within a limited range, so as to cause a scrubbing operation. With this configuration, an advantageous effect is obtained in that a proper scrubbing amount can be provided even in pads with small areas.

A further aspect of the invention is characterized in that, in the parallel spring probe structure, one or more of the plurality of horizontal beams are electrically connected (i.e., conductively connected) to the vertical probe which is to be in contact with a to-be-inspected semiconductor to form a signal wire conducting section, and others of the horizontal beams are electrically insulated from the vertical probe to form a signal wire non-conducting section. With this configuration, advantageous effects are obtained that the electric capacity can be made small, and that a chip with high-speed and high-capacity signals can be inspected.

A further aspect of the invention is characterized in that, in the parallel spring probe structure, the probe includes a link mechanism in which a part of the vertical probe is electrically insulated, a portion of the vertical probe to be in contact with a to-be-inspected semiconductor which is electrically connected to one or more horizontal beams forms a link mechanism as a signal wire conducting section, and a portion of the vertical probe to be electrically insulated from the portion to be in contact with the semiconductor forms a link mechanism as a signal non-conducting section including a connecting portion for the other horizontal beams. With this configuration, advantageous effects are obtained that the electric capacity can be made small, and that a chip with high-speed and high-capacity signals can be inspected.

A further aspect of the invention is characterized in that the insulating section is made from rigid material, and is connected firmly to the conducting section. Therefore, although being insulated electrically, the invention has an almost the same operation as that of a parallel spring as a mechanically continued link mechanism. For this reason, advantageous effects are obtained in that the behavior of the probe tip can be more precisely controlled, and a probe with small electric capacity can be provided.

DETAILED DESCRIPTION OF THE PREFERRED EMBODIMENTS

The embodiments of the invention will be described with reference to the accompanying drawings. The invention, however, is not limited to these embodiments.

First Embodiment

Figure 1:
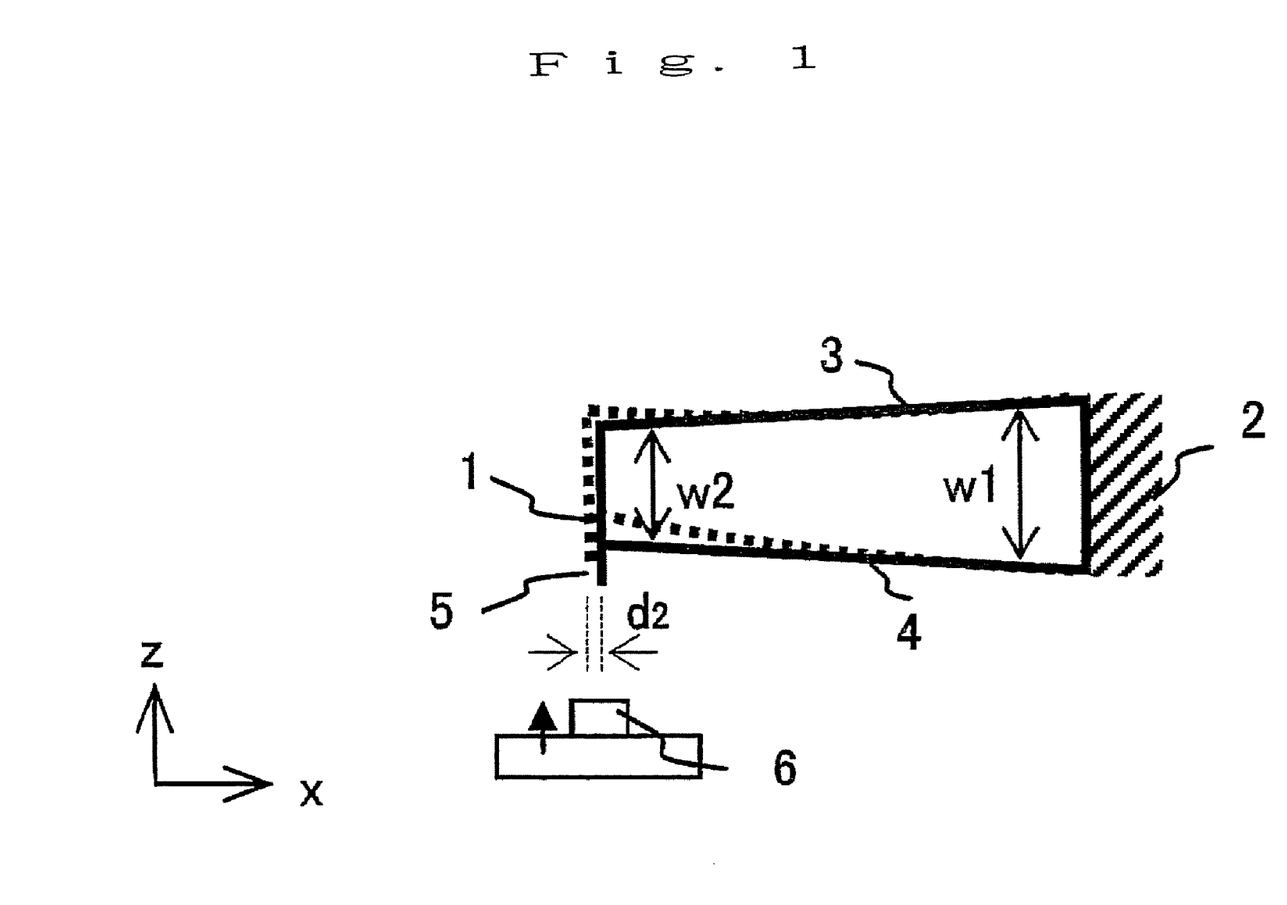
FIG. 1 illustrates a basic structure of a probe according to a first embodiment of the invention.

FIG. 1 illustrates a basic structure of a probe according to the first embodiment of the invention. In FIG. 1, a vertical probe 1, a fixed end 2, horizontal beams 3 and 4, a probe tip 5, and a circuit pad 6 to be inspected are shown. The vertical probe 1, the fixed end 2, and the horizontal beams 3 and 4 altogether constitute a parallel spring which is based on a principle of a link mechanism. The structure of FIG. 1 differs from a conventional structure shown in FIG. 7B in that the distance between the horizontal beams 3 and 4 varies along the horizontal direction. FIG. 1 shows a structure in which the distance between the horizontal beams continuously decreases from w1 at the side of the fixed end toward w2 at the side of the vertical probe.

The operation of the probe structure will be described with reference to FIG. 1. The horizontal beams 3 and 4 of the probe are kept substantially horizontal (shown by the solid lines in the drawing) until the pad 6 moves vertically (in the Z direction of the XYZ three-dimensional orthogonal coordinate system) and touches the vertical probe tip 5. After the pad 6 is brought into contact with the probe tip 5 and overdrive is provided to lift the probe tip 5 in a certain amount, the horizontal beams 3 and 4 rotate separately, followed by movement of the vertical probe 1. Since the horizontal beams 3 and 4 are not parallel with each other and have different initial angles, they follow different trajectories as they rotate. As a result, as shown in the dotted line in the drawing, the vertical probe 1 follows a trajectory different from that of parallel horizontal beams 3 and 4.

Figure 2:
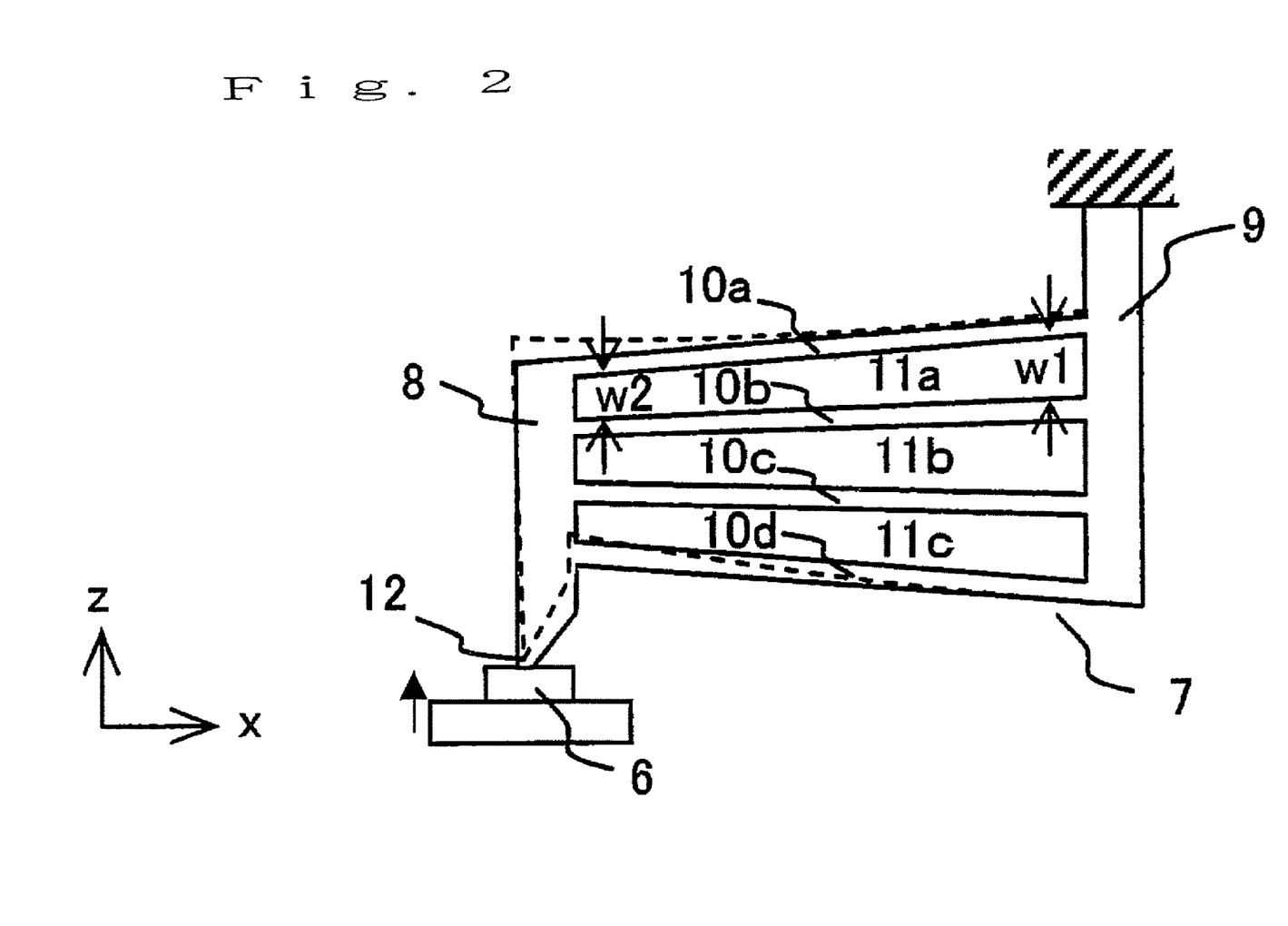
FIG. 2 is a side view of a probe structure according to the first embodiment of the invention.

FIG. 2 illustrates the basic structure of FIG. 1 provided with plural linkage mechanisms. FIG. 2 illustrates a probe 7, a vertical probe portion 8, a fixed portion 9, horizontal beams 10a to 10d, slits 11a to 11c, and a pad 6. The probe 7 is made from a thin elastic metal plate, and consists of the vertical probe 8, the fixed portion 9 and four horizontal beams 10a to 10d. The vertical probe 8 opposites to the pad 6. The probe tip 12 is sharply tapered. The fixed portion 9 is supported by an external support means (not shown). The horizontal beams 10a to 10d are almost identical in cross sections. The slits 11a to 11c are provided to define the horizontal beams 10a to 10d separately from a thin plate.

Such a configuration can be obtained by decreased distance from a neutral plane at which the maximum bending stress is generated, i.e., by narrow widths of the beams. The above configuration is provided to address problems that, when a proper spring constant is to be obtained by one or a few connecting beams, the beams must become longer, which may cause the device size growing.

The operation will be described with reference to FIG. 2. The horizontal beams 10a to 10d of the probe are kept substantially horizontal (shown by the solid lines in the drawing) until the pad 6 moves vertically (in the Z direction) and touches the vertical probe tip 12. After the pad 6 is brought into contact with the probe tip 12 and overdrive is provided to lift the probe tip 12 in a certain amount, the horizontal beams 10a to 10d rotate separately, followed by movement of the vertical probe 8. Since the horizontal beams 10a to 10d are not parallel with one another and have different initial angles, they follow different trajectories as they rotate. As a result, as shown in the dotted line in the drawing, the vertical probe 8 follows a trajectory different from that of parallel horizontal beams 10a to 10d.

Although the parallel spring described above is formed by three linkage mechanisms constituted by four horizontal beams and three slits, the number and shape of the linkage mechanism are not limited thereto.

Figure 3A:
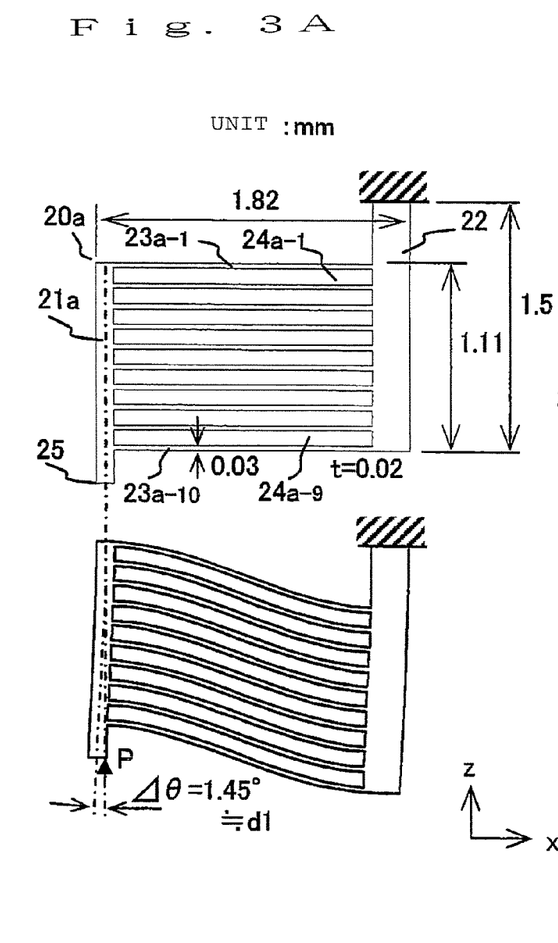
FIGS. 3A and 3B are side views illustrating operation of the probe according to the first embodiment of the invention.
Figure 3B:
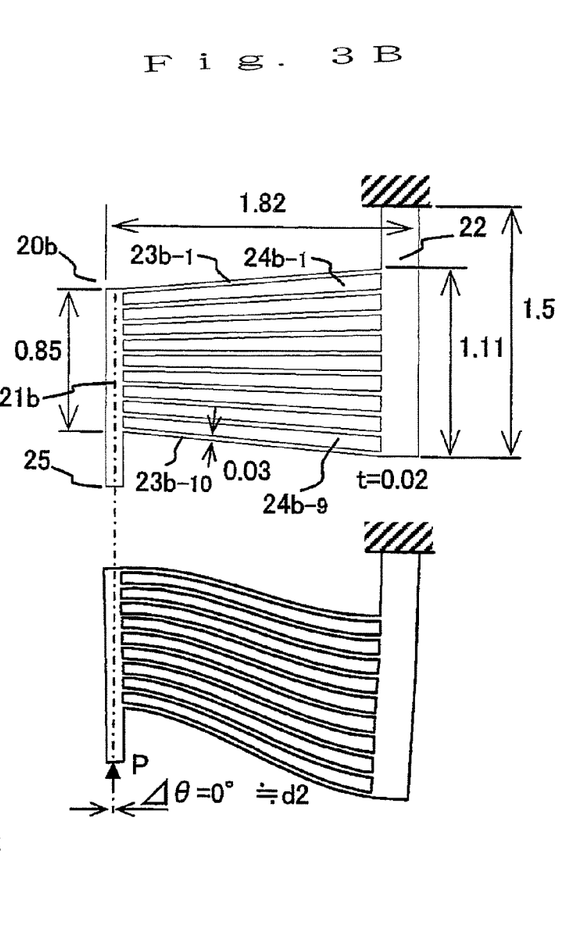

The operation in the first embodiment will be described with concrete numerical values. FIG. 3A and FIG. 3B illustrate comparison through the finite element calculation in behaviors of the vertical probes between a parallel spring probe constituted by plural linkage mechanisms with parallel horizontal beams and a parallel spring probe constituted by the same number of linkage mechanisms with horizontal beams arranged at varying distances from one another.

In FIG. 3A, a parallel spring probe 20a is shown which includes ten horizontal beams and nine slits between the beams. The probe 20a includes a vertical probe portion 21a, a fixed portion 22, horizontal beams 23a-1 to 23a-10, slits 24a-1 to 24a-9 and a probe tip 25. The horizontal beams 23a-1 to 23a-10 are parallel to and equally spaced from one another. The width of the horizontal beam is 0.03 mm. The horizontal beams are formed from beryllium copper having thickness of 0.02 mm. Other main dimension values are as illustrated in FIG. 3A.

In FIG. 3B a parallel spring probe 20b is shown which includes ten horizontal beams and nine slits between the beams. The probe 20b includes a vertical probe portion 21b, horizontal beams 23b-1 to 23b-10, and slits 24b-1 to 24b-9. The distance between each of the horizontal beams 23b-1 to 23b-10 continuously decreases from the side of the fixed portion 22 toward the vertical probe 21b. The decreasing ratio is constant between any of the horizontal beams 23b-1 to 23b-10. The width of the horizontal beam is 0.03 mm. The horizontal beams are formed from beryllium copper having thickness of 0.02 mm. Other main dimension values are as illustrated in FIG. 3B.

In the above-described models, Z-direction load P was given at the probe tips 25 and the behavior of the probe tips 25 were compared. As a result, the probe tip 25 of the model shown in FIG. 3A was inclined by 1.45 degrees with respect to the Z-axis while the probe 25 of the model shown in FIG. 3B was inclined by about 0 degrees.

The inclination, i.e., the approximate X-direction displacement of the probe tip 25 can be determined by selecting length, width, thickness, distance between the horizontal beams and the spring constant depending on the material of the beams of the probe such that the inclination is within the range of $0 \approx d2 < d1 < d0$, in comparison with the example shown in FIG. 7.

Second Embodiment

Figure 4A:
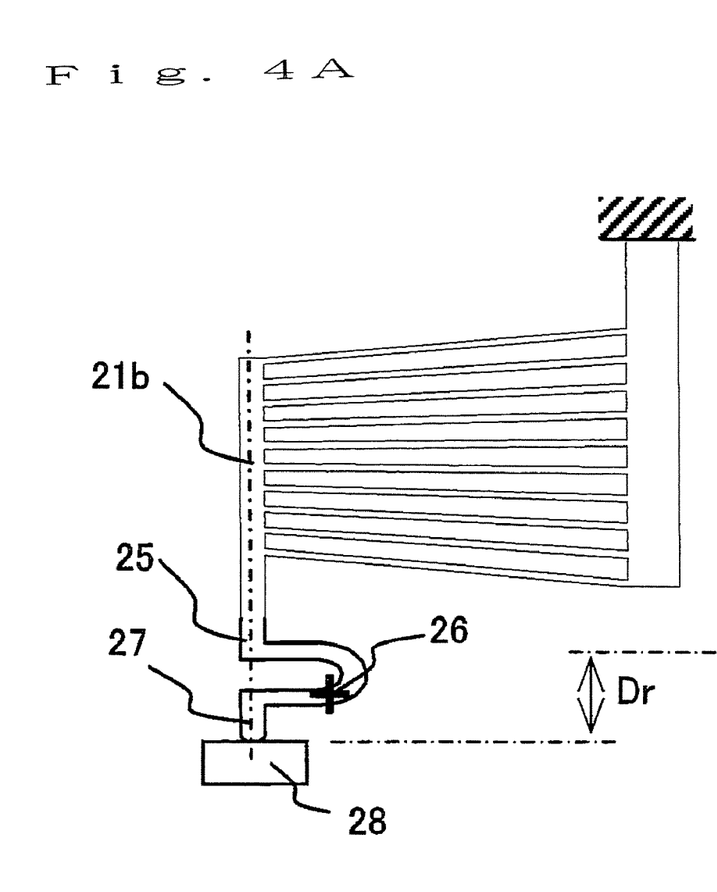
FIGS. 4A and 4B are side views of a probe structure with a rotary tip according to a second embodiment of the invention.
Figure 4B:
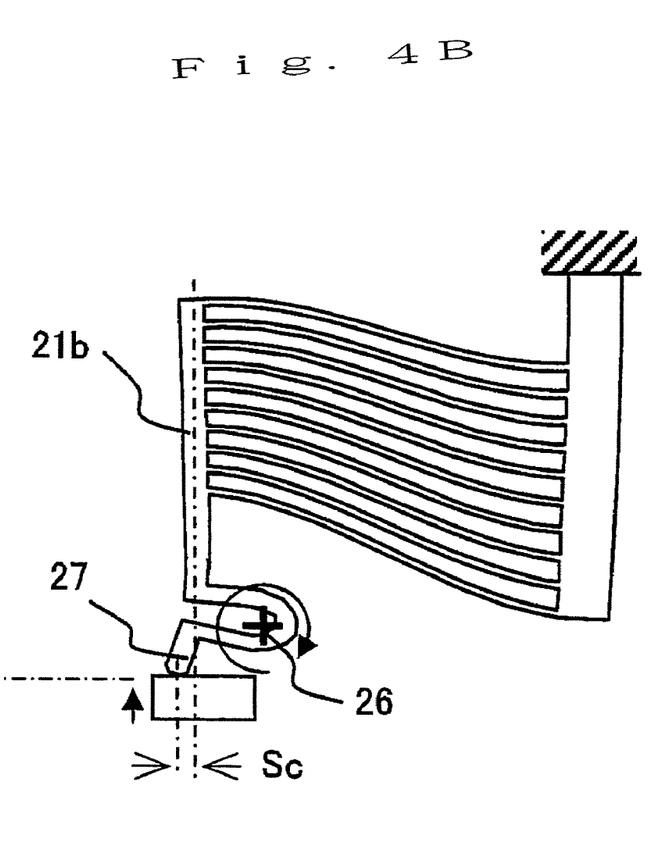

FIG. 4 illustrates a probe structure according to the second embodiment of the invention. In the present embodiment, a rotationally deformed section 27 is provided in series to the probe tip 25 of the model shown FIG. 3B. In FIG. 4, a center of rotation of the rotationally deformed section 27 is denoted by reference numeral 26 and a pad is denoted by reference numeral 28.

The operation will be described with reference to FIG. 4. In FIG. 4A, the probe is in the illustrated state until the pad 28 moves vertically and touches the probe tip. As shown in FIG. 4B, after the pad 28 is brought into contact with a tip of the rotationally deformed section 27 and overdrive (represented as "Dr" in the drawing) is provided to vertically lift the tip in a certain amount, the vertical probe 21b moves only in the Z-direction without tilting as shown in FIG. 3B. Thus, X-direction displacement of the tip of the rotationally deformed section 27 connected to the vertical probe 21 depends only on displacement accompanying the rotation of the center of rotation 26.

The rotationally deformed section 27 moves in the vertical direction only following the movement of the vertical probe 21b in the Z-direction. At the same time, as the overdrive is further provided, the rotationally deformed section 27 rotates clockwise about the center of rotation 26. In FIG. 4B, scrubbing amount is denoted by Sc. The movement of the rotationally deformed section 27 is the same as described in FIG. 10, and thus description thereof will be omitted.

As described above, the moving function of the parallel spring structural part which mainly moves vertically and the moving function of the rotationally deformed section which mainly moves horizontally are separated in the present embodiment. Thus, relatively large overdrive (Dr) can be provided and precise control on the scrubbing amount (Sc) can be provided even in a compact parallel spring probe.

Third Embodiment

Figure 5:
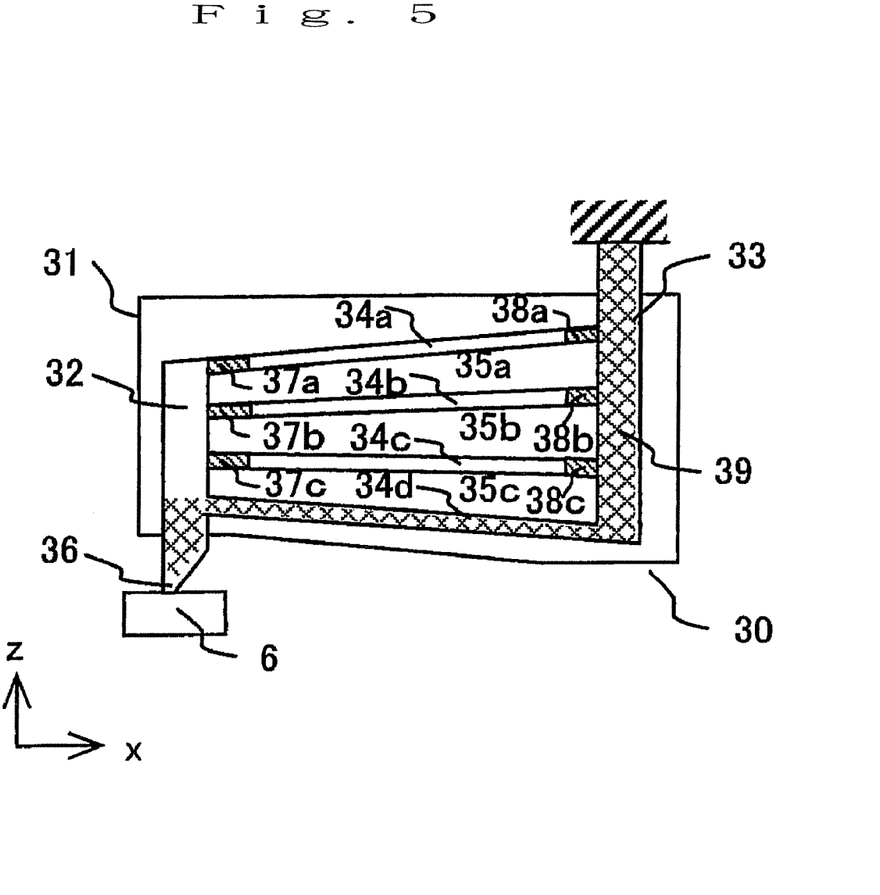
FIG. 5 is a side view of a film probe according to a third embodiment of the invention.

A probe structure according to the third embodiment of the invention is shown in FIG. 5. In the present embodiment, the probe is formed by etching copper foil on a resin film. As shown in FIG. 5, copper foil (e.g., beryllium copper) is made to adhere to a resin film (e.g., polyimide resin) 31, and the copper foil is etched to form a vertical probe 32, a fixed portion 33 and horizontal beams 34a to 34d. The fixed portion 33 is supported by an external support means and an inspection equipment circuit (not shown). The insulating sections 37a to 37c and 38a to 38c are formed by printing insulating resin between the horizontal beams 34a to 34c and the vertical probe 32 and between the horizontal beams 34a to 34c and the fixed portion 33.

Function of the thus-structured film probe 30 will be described with reference to the drawing. When the pad 6 is brought into contact with the probe tip 36 and inspection signals flow, the horizontal beams 34a to 34c are electrically insulated by the insulating sections 37a to 37c or 38a to 38c. Accordingly, the inspection signals flow only into the signal conducting section 39 shown in diagonal lines in the drawing. Since no charge is accumulated between the insulated areas of the horizontal beams 34a to 34b, a probe with small electric capacity can be obtained.

The insulating sections 37a to 37c and 38a to 38c are made from cured insulating resin and thus are rigid. Although being insulated electrically, the probe 30 has almost the same mechanical function as that of the probe with plural parallel springs shown in FIG. 2.

Fourth Embodiment

Figure 6:
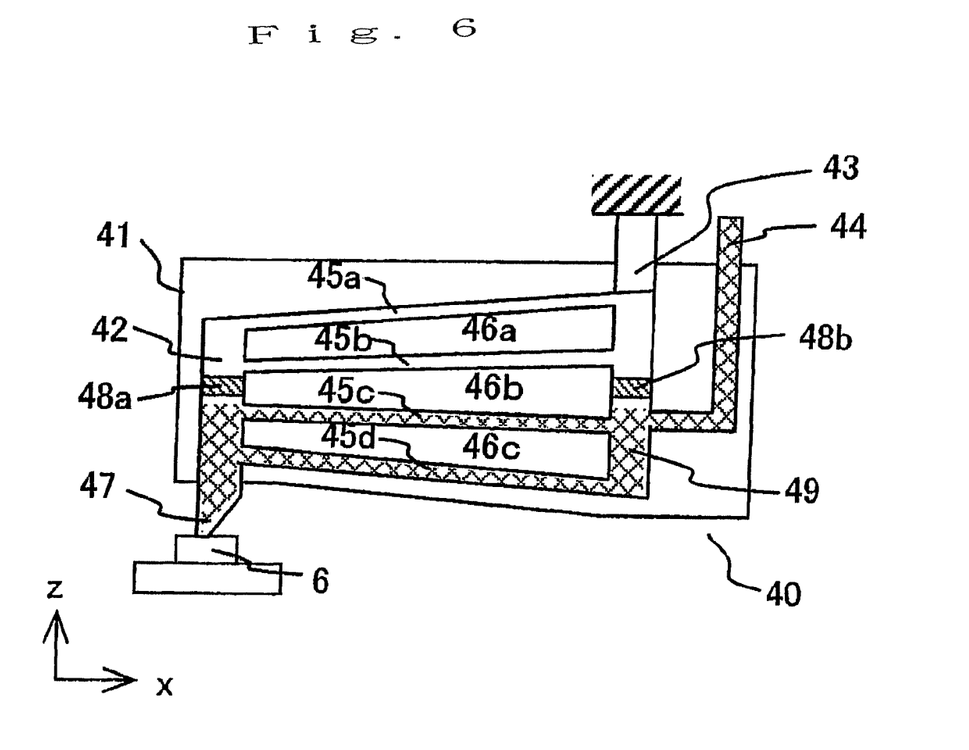
FIG. 6 is a side view of a film probe according to a fourth embodiment of the invention.

A probe structure according to the fourth embodiment of the invention is shown in FIG. 6. In the present embodiment, the probe is formed by etching copper foil on a resin film as in the third embodiment. As shown in FIG. 6, copper foil (e.g., beryllium copper) is made to adhere to a resin film (e.g., polyimide resin) 41, and the copper foil is etched to form a vertical probe 42, a fixed portion 43 and horizontal beams 45a to 45d. The fixed portion 43 is supported by an external support means (not shown). The insulating section 48a is formed by isolating a part of the vertical probe 42 and printing the insulating resin on the isolated portion. The insulating section 48b is formed by isolating a part of the fixed portion 43, and printing the insulating resin on the isolated portion. A conductor 44 is formed by etching to connect a part of the fixed portion 43 to an inspection equipment circuit (not shown).

Function of the thus-structured film probe 40 will be described with reference to the drawing.

The vertical probe 42 is electrically insulated by the insulating section 48a and the fixed portion 43 is electrically insulated by the insulating section 48b. When the pad 6 is brought into contact with the probe tip 47 and inspection signals flow, the parallel spring portion constituted by the horizontal beams 45a and 45b become a signal non-conducting section. Accordingly, the inspection signals flow only into the signal conducting section 49 shown in diagonal lines in the drawing which includes the parallel spring portion constituted by the horizontal beams 45c and 45d. Since no charge is accumulated between the insulated area of the horizontal beams 45a and 45b, a probe with small electric capacity can be obtained.

The insulating sections 48a and 48b are made from cured insulating resin and thus are rigid. Although being insulated electrically by the insulating sections 48a and 48b, the probe 40 has almost the same mechanical function as that of the probe with plural parallel springs shown in FIG. 2.

According to the present embodiment, all of the parallel springs which are the signal non-conducting sections can be connected to a grounded circuit. Thus, a more electrically stable probe can be obtained.

The insulation site of the insulating resin is determined depending on the probe structure, and is not limited to the described sites.

In order to meet the requirements for various pad arrangements and various pad intervals depending on LSI circuit designs, a probe is provided according to the invention in which behavior of the portion near the contact including overdrive and scrubbing function can be precisely controlled. The probe has small electric capacity and can be used for inspection of chips having high-speed and high-capacity signals.

Although preferred embodiments illustrated in the drawings have been described above, it is apparent to those skilled in the art that various changes and modifications can be easily made to the invention without departing the scope of the invention. It is contemplated that the invention includes such changes and modifications.

What is claimed is:

1. A contact with plural beams comprising a plurality of link mechanisms, the plurality of link mechanisms comprising:

a fixed portion;
a vertically extending probe portion; and
four or more linear or curved horizontal beams extending in a direction perpendicular to the vertical direction, the beams being fastened to the fixed portion at one ends and connected to the vertically extending probe portion at the other ends,
wherein each link mechanism in the plurality of link mechanisms comprises the fixed portion, the vertically extending probe portion, and a pair of adjacent horizontal beams in said four or more horizontal beams, so that the plurality of link mechanisms comprises three or more link mechanisms; and
wherein the distance between at least one pair of adjacent horizontal beams in said four or more horizontal beams varies along a direction perpendicular to the vertical direction.

2. A contact with plural beams according to claim 1, wherein the distance between the horizontal beams varies continuously or discontinuously along the direction perpendicular to the vertical direction such that the distance is largest near the fixed portion and is smallest near the vertically extending probe portion.

3. A contact with plural beams according to claim 2, wherein a rotationally deformed section is provided in series to a tip of the vertical probe, the rotationally deformed section includes a curved surface which rotates about one or more of rotational centers when overdrive is provided, relative displacement is caused between the tip of the rotationally deformed section and a pad surface when the tip and the pad surface are brought into contact at a point or within a limited range, so as to cause a scrubbing operation.

4. A contact with plural beams according to claim 2, wherein the vertically extending probe portion comprises a probe tip; and
wherein, when the vertically extending probe portion undergoes a force in the vertical direction, the probe tip undergoes movement in the vertical direction but undergoes substantially zero movement in the horizontal direction.

5. A contact with plural beams according to claim 1, wherein a rotationally deformed section is provided in series to a tip of the vertical probe, the rotationally deformed section includes a curved surface which rotates about one or more of rotational centers when overdrive is provided, relative displacement is caused between the tip of the rotationally deformed section and a pad surface when the tip and the pad surface are brought into contact at a point or within a limited range, so as to cause a scrubbing operation.

* * * * *